(12) United States Patent
Bekiaris et al.

(10) Patent No.: US 9,711,397 B1
(45) Date of Patent: Jul. 18, 2017

(54) COBALT RESISTANCE RECOVERY BY HYDROGEN ANNEAL

(71) Applicant: APPLIED MATERIALS, INC., Santa Clara, CA (US)

(72) Inventors: Nikolaos Bekiaris, Campbell, CA (US); Mehul Naik, San Jose, CA (US); Zhiyuan Wu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/140,955

(22) Filed: Apr. 28, 2016

Related U.S. Application Data

(63) Continuation-in-part of application No. 15/075,039, filed on Mar. 18, 2016.

(51) Int. Cl.
*H01L 21/768* (2006.01)
*H01L 21/285* (2006.01)

(52) U.S. Cl.
CPC .. *H01L 21/76834* (2013.01); *H01L 21/28568* (2013.01); *H01L 21/76814* (2013.01); *H01L 21/76826* (2013.01); *H01L 21/76828* (2013.01); *H01L 21/76877* (2013.01)

(58) Field of Classification Search
CPC ......... H01L 21/76834; H01L 21/76814; H01L 21/76883
See application file for complete search history.

(56) References Cited

U.S. PATENT DOCUMENTS

2014/0227462 A1* 8/2014 Okuno .................... C22C 21/00
428/1.62
2015/0021779 A1* 1/2015 Liou ................. H01L 21/76883
257/773

OTHER PUBLICATIONS

U.S. Appl. No. 15/075,039, filed Mar. 18, 2016 (Nikolaos Bekiaris, et al., inventor), Unpublished.

* cited by examiner

*Primary Examiner* — Mamadou Diallo
(74) *Attorney, Agent, or Firm* — Fish & Richardson P.C.

(57) ABSTRACT

Resistance increase in Cobalt interconnects due to nitridation occurring during removal of surface oxide from Cobalt interconnects and deposition of Nitrogen-containing film on Cobalt interconnects is solved by a Hydrogen thermal anneal or plasma treatment. Removal of the Nitrogen is through a thin overlying layer which may be a dielectric barrier layer or an etch stop layer.

20 Claims, 4 Drawing Sheets

COBALT RESISTANCE RECOVERY BY HYDROGEN ANNEAL

CROSS-REFERENCE TO RELATED APPLICATION

This application is a continuation-in-part of U.S. application Ser. No. 15/075,039, filed Mar. 18, 2016 entitled COBALT RESISTANCE RECOVERY BY HYDROGEN ANNEAL by Nikolaos Bekiaris, et al.

BACKGROUND

Technical Field

The disclosure concerns a method of forming layered structures having conductive Cobalt interconnects for interlayer connectivity in an integrated circuit such as a complementary metal oxide semiconductor (CMOS) structure.

Background Discussion

As critical dimension (CD) is reduced for CMOS devices, line resistance of the conductive interconnects increases. The conductive interconnects are typically Copper. In order to address the problem of increasing line resistance, the conductive interconnects may be formed of Cobalt instead of Copper.

Following chemical mechanical polishing (CMP), exposed surfaces of the Cobalt interconnects tend to form an overlying thin Cobalt oxide layer, which must be removed. One method for removing the thin Cobalt oxide layer is to treat the structure with an ammonia plasma (a plasma formed of NH3). This treatment can enhance time dependent dielectric breakdown (TDDB) behavior of the structure. It is a challenge for one to remove the Cobalt oxide layer without damaging the under layer.

SUMMARY

In accordance with a first aspect, a method of processing a workpiece comprises forming on the workpiece a dielectric layer and an interlayer interconnect extending through the dielectric layer, removing oxide from an exposed surface of the interlayer interconnect by treating the workpiece in a plasma formed of a Nitrogen-containing gas, and depositing on the interlayer interconnect a dielectric barrier layer of a thickness not exceeding a threshold thickness of 100 Angstroms. The method further comprises reducing resistance of the interlayer interconnect by removing Nitrogen from the interlayer interconnect through the dielectric barrier layer and increasing thickness of the dielectric barrier layer above the threshold thickness.

In one embodiment, the Nitrogen-containing gas comprises ammonia. In one embodiment, the interlayer interconnect comprises Cobalt.

In one embodiment, the threshold thickness may be about 20 Angstroms.

In one embodiment, the removing Nitrogen from the interlayer interconnect comprises exposing the workpiece to a Hydrogen plasma, radicals or Hydrogen thermal anneal.

In one embodiment, the dielectric barrier layer comprises Silicon and one or more of the following: Carbon, Oxygen, Nitrogen.

In one embodiment, the threshold thickness is sufficiently small to permit removal of Nitrogen through the dielectric barrier layer by a Hydrogen plasma, radicals or Hydrogen thermal anneal.

In accordance with a second aspect, a method of processing a workpiece comprises forming on the workpiece a dielectric layer and an interlayer interconnect extending through the dielectric layer and removing oxide from an exposed surface of the interlayer interconnect by treating the workpiece in a plasma formed from a Nitrogen-containing gas or Hydrogen plasma, radicals or thermal anneal. The method further comprises depositing on the interlayer interconnect an etch stop layer of a thickness less than a threshold thickness, reducing resistance of the interlayer interconnect by removing Nitrogen from the interlayer interconnect through the etch stop layer, and increasing thickness of the etch stop layer above the threshold thickness.

In one embodiment, the interlayer interconnect comprises Cobalt.

In one embodiment, the removing Nitrogen from the interlayer interconnect comprises exposing the workpiece to a Hydrogen plasma, radicals or Hydrogen thermal anneal.

In one embodiment, the etch stop layer comprises a Nitrogen-containing material such as AlN.

In one embodiment, the Nitrogen-containing gas comprises ammonia.

In one embodiment, the threshold thickness is sufficiently small to permit removal of Nitrogen through the etch stop layer by a Hydrogen plasma, radicals or Hydrogen thermal anneal.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
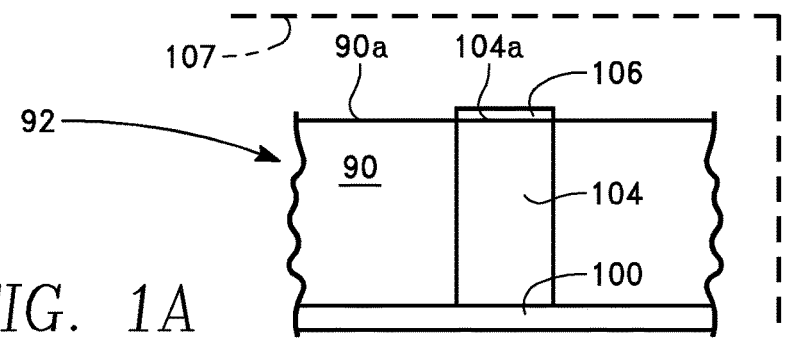
FIGS. 1A, 1B, 1C, 1D and 1E depict successive side views of an integrated circuit structure, the successive side views corresponding to a sequence of process operations.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

As previously mentioned, removing the Cobalt oxide layer without damaging an under layer is challenging. One problem we have discovered with Cobalt interconnects is that exposure to Nitrogen or Nitrogen-containing substances, such as an ammonia plasma, causes the resistance of the Cobalt interconnect to increase. We believe this is due to nitridation of the Cobalt interconnects. This increase can be significant, e.g., about 5% to 25%, depending upon structure size and device density. Therefore, one problem is how to avoid increased resistance due to nitridation.

In some cases, a dielectric barrier layer is deposited on the Cobalt interconnects after Cobalt oxide removal. Such a dielectric barrier layer contains Silicon in combination with other materials such as Carbon, Oxygen and/or Nitrogen. Contact of the Cobalt interconnect with the Silicon-containing barrier layer causes silicidation of the Cobalt interconnect. Such silicidation increases the line resistance of the Cobalt interconnect. Therefore, a second problem is how to provide a Silicon-containing barrier layer on top of the Cobalt interconnect without causing a resistance increase due to silicidation of the Cobalt interconnect by Silicon from the etch stop layer.

In other cases, an etch stop layer is deposited over the Cobalt interconnects after Cobalt oxide removal. The etch stop layer is typically a Nitrogen-containing material such as aluminum nitride (AlN) and is left in place at least until completion of a subsequent etch operation in the process. Even if a non-ammonia process is used for Cobalt oxide removal (e.g. Hydrogen plasma, radicals or gas anneal), contact of the Nitrogen-containing etch stop layer with the Cobalt interconnect leads to nitridation of the Cobalt interconnect, which increases line resistance of the Cobalt interconnects. Therefore, a third problem is how to provide a Nitrogen-containing etch stop layer on top of the Cobalt interconnect without causing a resistance increase due to nitridation of the Cobalt interconnect by Nitrogen from the etch stop layer.

Figure 2:
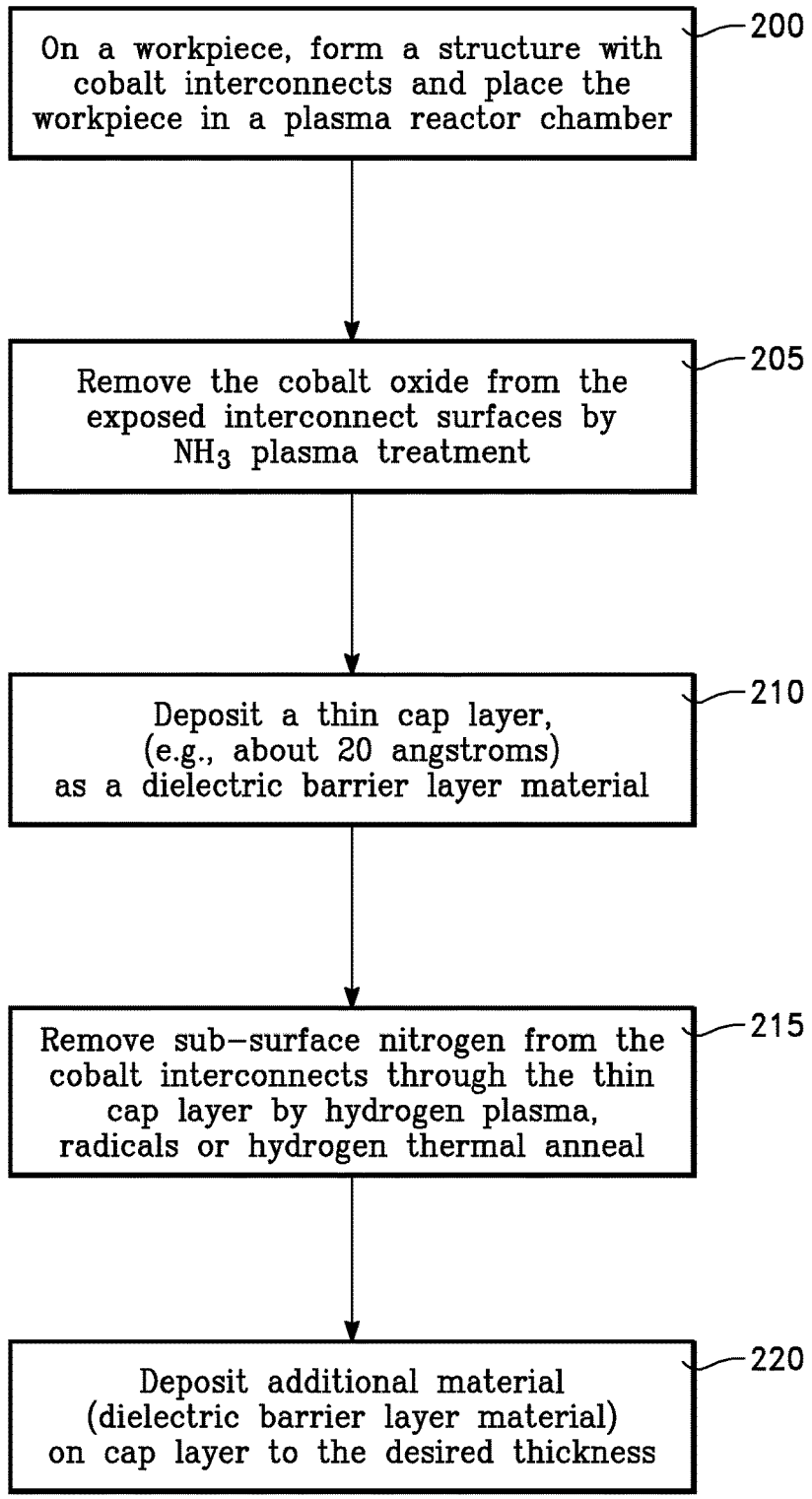
FIG. 2 is a block flow diagram of the sequence of process operations corresponding to the succession of FIG. 1A through FIG. 1E.

Referring to FIG. 1A and block 200 of FIG. 2, a dielectric layer 90 is one of plural layers of a multilayer semiconductor structure formed on a workpiece 92 such as a semiconductor wafer. The dielectric layer 90 may include a bottom dielectric layer 100 of a material having a low dielectric constant. A Cobalt interconnect 104 extends from the bottom dielectric layer 100 through the dielectric layer 90 to top surface 90a of the dielectric layer 90. The structure includes a large number of Cobalt interconnects, only one of which is illustrated in the drawings. Thus, the Cobalt interconnect 104 is one of plural interconnects extending through the dielectric layer 90. The workpiece 92 is treated by chemical mechanical polishing, which leaves top surface 104a of the Cobalt interconnect 104 exposed. The top surface 104a oxidizes upon exposure to form a Cobalt oxide layer 106. The workpiece 92 is placed in a plasma reactor chamber 107 (indicated in dashed line) where it may remain during the rest of the process of FIG. 2. Alternatively, different operations of the process can be done in different chambers, not necessarily in one chamber.

Figure 1B:
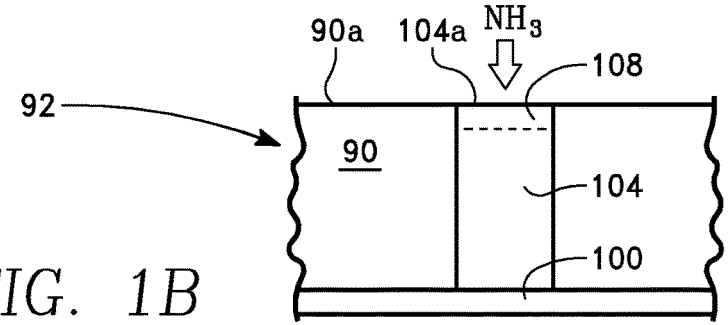

As depicted in FIG. 1B, the Cobalt oxide layer 106 is removed by an oxide reduction process that employs an ammonia plasma (block 205 of FIG. 2). Some Nitrogen from the ammonia plasma accumulates below the top surface 104a and forms a Nitrogen-containing zone 108 in the Cobalt interconnect 104. This may be referred to as nitridation. The presence of the Nitrogen in the Cobalt interconnect 104 increases the electrical resistance of the Cobalt interconnect.

The Nitrogen-containing zone 108 is resistant or immune to silicidation, and is left in place temporarily to prevent silicidation during subsequent deposition of a Silicon-containing dielectric barrier layer, as will now be described.

Figure 1C:
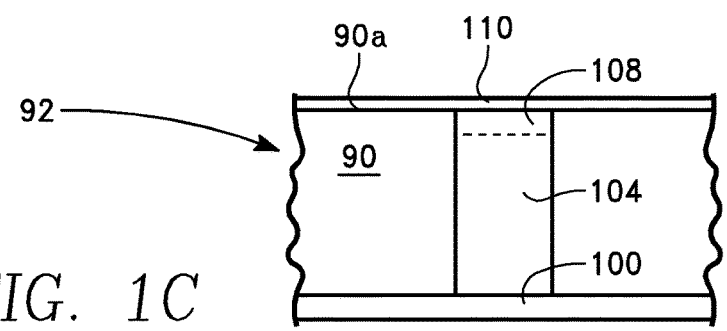

As shown in FIG. 1C, a dielectric barrier layer 110 is deposited (block 210 of FIG. 2). This deposition may be performed using a plasma enhanced chemical vapor deposition (PECVD) process or using a physical vapor deposition (PVD) process or using an atomic layer deposition (ALD) process, for example. The dielectric barrier layer 110 is thin (about 20 Angstroms). The dielectric barrier layer 110 may be a Silicon-containing material including other materials such as Carbon, Oxygen and/or Nitrogen and/or may be characterized by a low dielectric constant.

Figure 1D:
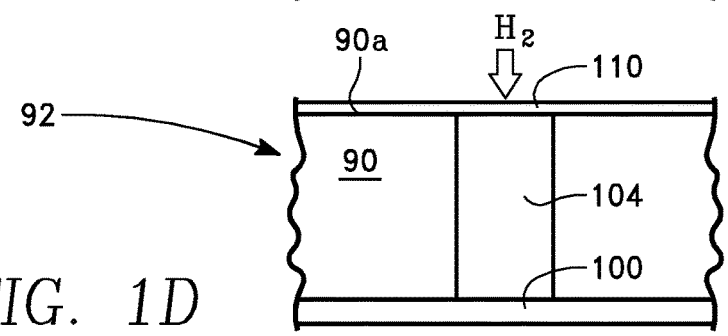

As shown in FIG. 1D, the Nitrogen in the Cobalt interconnect 104 is removed by Hydrogen plasma, radicals or Hydrogen thermal anneal that employs Hydrogen in the chamber (block 215 of FIG. 2). The dielectric barrier layer 110 is sufficiently thin (e.g., 20 Angstroms, or less 100 Angstroms or in a range of 5-100 Angstroms) for the Nitrogen to be removed through the dielectric barrier layer 110 from the Cobalt interconnect 104 by Hydrogen plasma, radicals or Hydrogen thermal anneal. Such removal of the Nitrogen undoes nitridation that would otherwise increase resistance of the Cobalt interconnect 104. We have found that this treatment by Hydrogen returns the resistance of the Cobalt interconnects to the original (lesser) value that it had prior to the exposure of the Cobalt interconnects to the ammonia plasma.

Figure 1E:
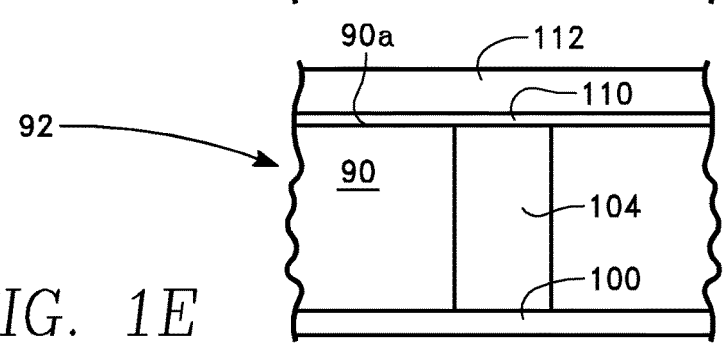

Thereafter, as shown in FIG. 1E, the thickness of the dielectric barrier layer 110 may be increased to a desired thickness (e.g., up to 300 Angstroms) by deposition of additional dielectric barrier layer material 112 (block 220 of FIG. 2). This deposition may be performed using a plasma enhanced chemical vapor deposition (PECVD) process or using a physical vapor deposition (PVD) process or using an atomic layer deposition (ALD) process, for example.

Figure 3:
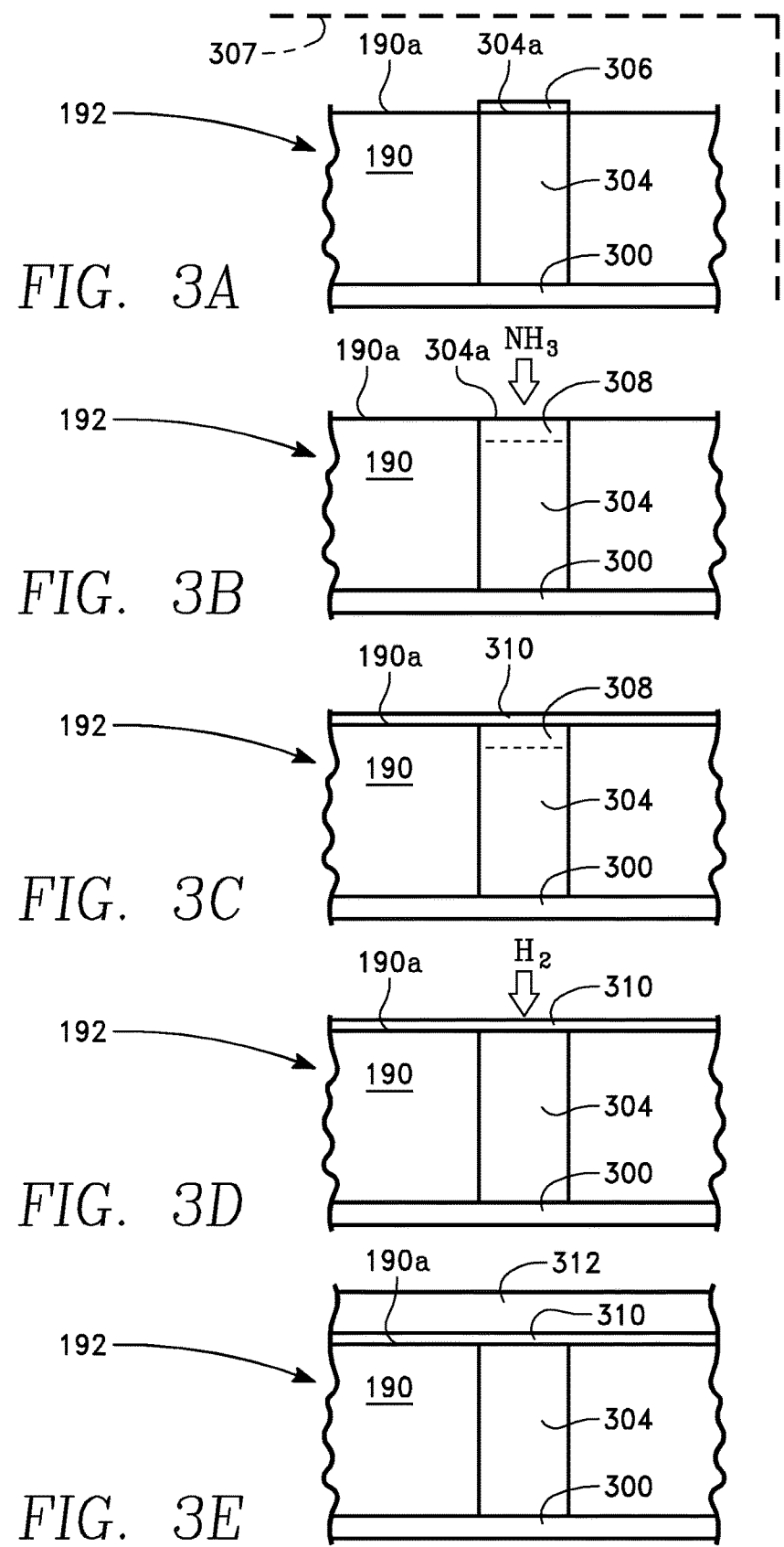
FIGS. 3A, 3B, 3C, 3D and 3E depict successive side views of an integrated circuit structure, the successive side views corresponding to a sequence of process operations.

A second embodiment will now be described. Referring to FIG. 3A and to block 400 of FIG. 4, a dielectric layer 190 is one of plural layers of a multilayer semiconductor structure formed on a workpiece 192 such as a semiconductor wafer. The dielectric layer 190 may include a bottom dielectric layer 300 of low dielectric constant. A Cobalt interconnect 304 extends from the bottom dielectric layer 300 through the dielectric layer 190 to top surface 190a of the dielectric layer 190. The structure includes a large number of Cobalt interconnects, only one of which is illustrated in the drawings. Thus, the Cobalt interconnect 304 is one of plural interconnects extending through the dielectric layer 190. The workpiece 192 is treated by chemical mechanical polishing, which leaves top surface 304a of the Cobalt interconnect 304 exposed. The top surface 304a oxidizes upon exposure to form a Cobalt oxide layer 306. The workpiece 192 is placed in a plasma reactor chamber 307 (indicated in dashed line) and may remain there during the rest of the process of FIG. 4. Alternatively, different operations of the process may be performed in different chambers.

Figure 4:
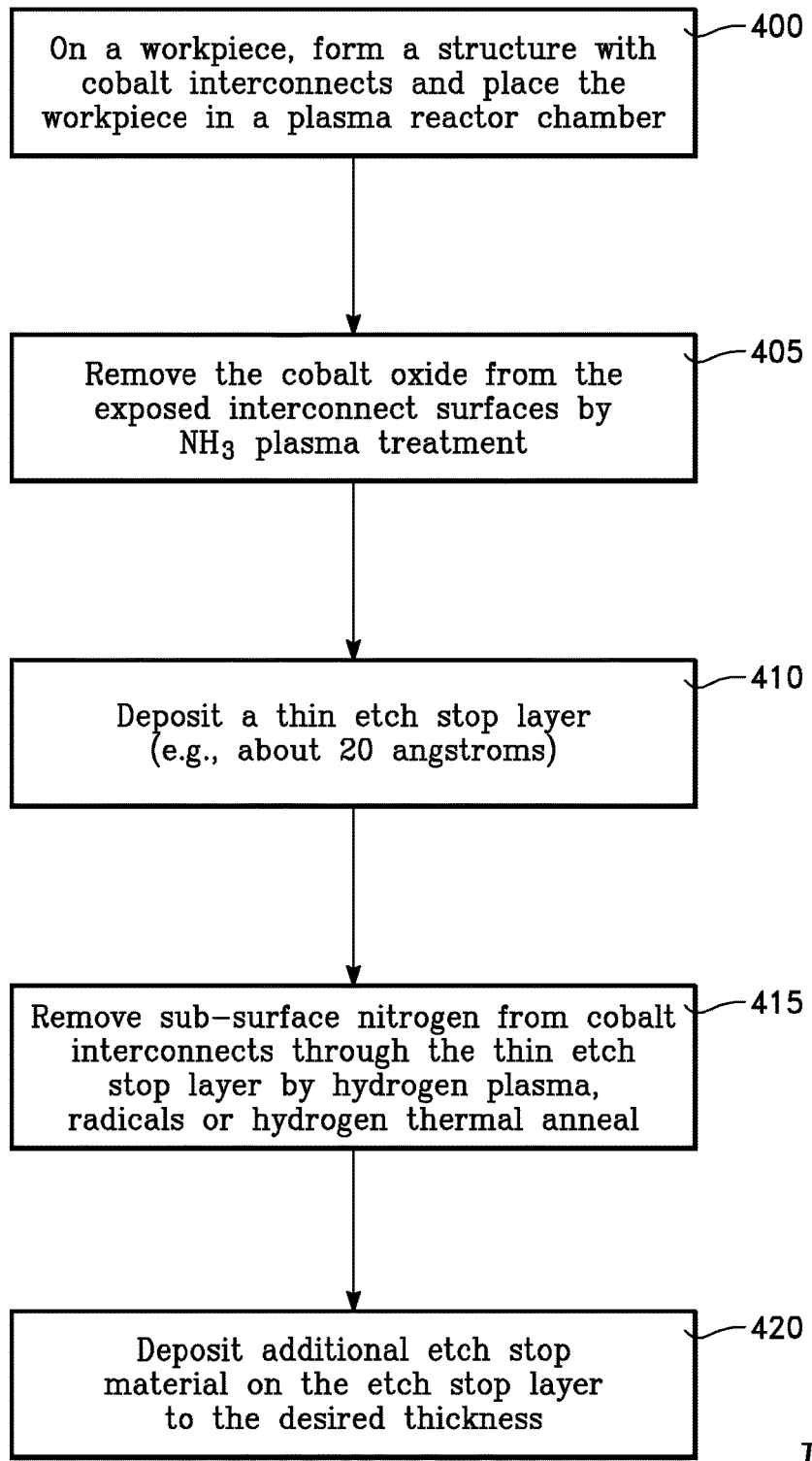
FIG. 4 is a block flow diagram of the sequence of process operations corresponding to the succession of FIG. 3A through FIG. 3E.

As depicted in FIG. 3B, the Cobalt oxide layer 306 is removed by generating an ammonia plasma in the reactor chamber (block 405 of FIG. 4). Alternatively, the Cobalt oxide removal may be performed in an active pre-clean process that employs active species such as (but not limited to) Hydrogen radicals. If the Cobalt oxide is removed using an ammonia plasma, then Nitrogen from the ammonia plasma accumulates below the top surface 304a to form a Nitrogen-containing zone 308 in the Cobalt interconnect 304. The presence of the Nitrogen in the Cobalt interconnect 304 increases the electrical resistance of the Cobalt interconnect.

As shown in FIG. 3C, an etch stop layer 310 is deposited (block 410 of FIG. 4). The etch stop layer 310 is thin (about 20 Angstroms). The etch stop layer 310 may be a Nitrogen-containing material such as aluminum nitride (AlN), and therefore its deposition contributes to nitridation of the Cobalt interconnect 304. This is a significant feature where an active pre-clean process was used to perform the Cobalt oxide removal, because the active pre-clean process does not provide nitridation of the Cobalt interconnect. In such a case, nitridation is provided by the AlN etch stop layer deposition. Deposition of the AlN etch stop layer 310 may be performed in a CVD process or in a PECVD process or in a physical vapor deposition (PVD) process or using an atomic layer deposition (ALD) process, for example.

As shown in FIG. 3D, Nitrogen in the Cobalt interconnect (e.g., in the Nitrogen-containing zone 308) is removed by Hydrogen plasma, radicals or Hydrogen thermal anneal in the chamber (block 415 of FIG. 4) using a Hydrogen gas (H2). The etch stop layer 310 is sufficiently thin (e.g., 20 Angstroms, or less than 100 Angstroms or in a range of 5-100 Angstroms) for the Nitrogen to be removed from the Cobalt interconnect 304 by the Hydrogen plasma, radicals or Hydrogen thermal anneal through the etch stop layer 310. This removal of the Nitrogen undoes nitridation that would otherwise increase electrical resistance of the Cobalt interconnect 304. The Hydrogen thermal anneal may be carried out in a temperature range of 200-500 degrees Celsius. We have found that this treatment by Hydrogen returns the resistance of the Cobalt interconnects to the original (lower) value that it had prior to the exposure of the Cobalt interconnects to Cobalt nitridation by ammonia plasma or Nitrogen-containing etch stop.

Thereafter, as shown in FIG. 3E, the thickness of the etch stop layer 310 may be increased to a desired thickness (e.g., up to 300 Angstroms) by deposition of additional etch stop material 312 (block 420 of FIG. 4) on the thin etch stop layer 310. The thin etch stop layer 310 protects the Cobalt interconnect from Nitrogen in the additional etch stop material 312. This deposition may be performed by CVD or PVD process or an ALD process, for example.

Advantages:

Embodiments described above solve the problem of resistance increase in Cobalt interconnects by nitridation and silicidation. Nitridation occurs during removal of surface oxide from the Cobalt interconnects by an ammonia plasma. Nitridation is removed by a Hydrogen treatment through a dielectric layer, and silicidation is prevented. The nitridation of the Cobalt interconnects is exploited by temporarily leaving the nitride in place while depositing a Silicon-containing layer. The nitride blocks silicidation of the Cobalt interconnects during deposition of the Silicon-containing layer. The Nitrogen is removed through the initial Silicon-containing layer, which is sufficiently thin to enable Hydrogen to draw out the Nitrogen in the Cobalt interconnects through the initial Silicon-containing layer. Thereafter, the thickness of the Silicon-containing layer may be increased by further deposition of the Silicon-containing material without silicidation of the Cobalt interconnects, because the initial thin layer of Silicon-containing material protects the Cobalt interconnects. The plasma reactor chamber 107 may be an integrated tool capable of performing each one of the processes or operations referred to above without removing the workpiece from the plasma reactor (integrated tool) 107. In one embodiment, an integrated tool performs the foregoing operations in the same chamber. In another embodiment, an integrated tool performs different operations in different chambers. In a further embodiment, different operations are performed in different tools.

Embodiments described above solve the problem of resistance increase in Cobalt interconnects by nitridation from a Nitrogen-containing etch stop layer (e.g., AlN). In this case, nitridation occurs by the exposure of Cobalt to a Nitrogen-containing film. Nitridation is removed by a Hydrogen treatment through an initial AlN layer. The initial AlN layer is sufficiently thin to enable the Hydrogen to draw out the Nitrogen in the Cobalt interconnects through the initial AlN layer. Thereafter, the thickness of the AlN layer may be increased by further deposition of AlN material without nitridation of the Cobalt interconnects, because the initial thin AlN layer protects the Cobalt interconnects. The plasma reactor chamber 107 may be an integrated tool capable of performing each one of the processes or operations referred to above without removing the workpiece from the plasma reactor chamber (integrated tool) 107. In one embodiment, an integrated tool performs the foregoing operations in the same chamber. In another embodiment, an integrated tool performs different operations in different chambers. In a further embodiment, different operations are performed in different tools.

While the foregoing is directed to embodiments of the present invention, other and further embodiments of the invention may be devised without departing from the basic scope thereof, and the scope thereof is determined by the claims that follow.

What is claimed is:

1. A method of processing a workpiece, comprising:
   forming on the workpiece a dielectric layer and an interlayer interconnect extending through said dielectric layer, said interlayer interconnect comprising conductive material;
   removing oxide from an exposed surface of said interlayer interconnect;
   depositing on said interlayer interconnect a deposition layer of a thickness less than a threshold thickness, said deposition layer comprising one of a dielectric barrier layer or an etch stop layer;
   reducing electrical resistance of said interlayer interconnect by removing Nitrogen from said interlayer interconnect through said deposition layer; and
   increasing thickness of said deposition layer above said threshold thickness, wherein said threshold thickness does not exceed 100 Angstroms.

2. The method of claim 1 wherein said interlayer interconnect comprises Cobalt.

3. The method of claim 1 wherein said removing Nitrogen from said interlayer interconnect comprises treating said interlayer interconnect with one of a Hydrogen plasma, radicals or Hydrogen thermal anneal.

4. The method of claim 1 wherein said threshold thickness is sufficiently small to permit removal of Nitrogen through said deposition layer by a Hydrogen plasma, radicals or Hydrogen thermal anneal.

5. The method of claim 4 wherein said Hydrogen thermal anneal is carried out in a temperature range of 200-500 degrees Celsius.

6. The method of claim 1 wherein said deposition layer is a dielectric barrier layer.

7. The method of claim 6 wherein said dielectric barrier layer comprises Silicon.

8. The method of claim 1 wherein said deposition layer is an etch stop layer comprising a Nitrogen-containing material.

9. The method of claim 8 wherein said etch stop layer comprises a nitride.

10. A method of processing a workpiece, comprising:
    providing an integrated tool;
    forming on the workpiece a dielectric layer and an interlayer interconnect extending through said dielectric layer, said interlayer interconnect comprising conductive material;

performing the following respective operations in respective chambers of said integrated tool:
(a) removing oxide from an exposed surface of said interlayer interconnect;
(b) depositing on said interlayer interconnect a deposition layer of a thickness less than a threshold thickness, said deposition layer comprising one of a dielectric barrier layer or an etch stop layer;
(c) reducing electrical resistance of said interlayer interconnect by removing Nitrogen from said interlayer interconnect through said deposition layer; and
(d) increasing thickness of said deposition layer above said threshold thickness.

11. The method of claim 10 wherein said interlayer interconnect comprises Cobalt.

12. The method of claim 10 wherein said removing Nitrogen from said interlayer interconnect comprises treating said interlayer interconnect with one of a Hydrogen plasma, radicals or Hydrogen thermal anneal.

13. The method of claim 12 wherein said Hydrogen thermal anneal is carried out in a temperature range of 200-500 degrees Celsius.

14. The method of claim 10 wherein said threshold thickness is sufficiently small to permit removal of Nitrogen through said deposition layer by a Hydrogen plasma, radicals or Hydrogen thermal anneal.

15. The method of claim 10 wherein said threshold thickness does not exceed 100 Angstroms.

16. A method of processing a workpiece, comprising:
providing a tool;
forming on the workpiece a dielectric layer and an interlayer interconnect extending through said dielectric layer, said interlayer interconnect comprising conductive material;
performing the following respective operations in one chamber of said tool:
(a) removing oxide from an exposed surface of said interlayer interconnect;
(b) depositing on said interlayer interconnect a deposition layer of a thickness less than a threshold thickness, said deposition layer comprising one of a dielectric barrier layer or an etch stop layer;
(c) reducing electrical resistance of said interlayer interconnect by removing Nitrogen from said interlayer interconnect through said deposition layer; and
(d) increasing thickness of said deposition layer above said threshold thickness.

17. The method of claim 16 wherein said interlayer interconnect comprises Cobalt.

18. The method of claim 16 wherein said removing Nitrogen from said interlayer interconnect comprises treating said interlayer interconnect with one of a Hydrogen plasma, radicals or Hydrogen thermal anneal.

19. The method of claim 16 wherein said threshold thickness is sufficiently small to permit removal of Nitrogen through said deposition layer by a Hydrogen plasma, radicals or Hydrogen thermal anneal.

20. The method of claim 16 wherein said threshold thickness does not exceed 100 Angstroms.

* * * * *